US012660111B2

(12) United States Patent
Shum et al.

(10) Patent No.: US 12,660,111 B2
(45) Date of Patent: Jun. 16, 2026

(54) LOCATION TAG HOUSING

(71) Applicant: Logistics & Supply Chain MultiTech R&D Centre Limited, Pok Fu Lam (HK)

(72) Inventors: Chin Yiu Shum, Pok Fu Lam (HK); Kee Yin Ng, Pok Fu Lam (HK)

(73) Assignee: Logistics & Supply Chain MultiTech R&D Centre Limited, Pok Fu Lam (HK)

( * ) Notice: Subject to any disclaimer, the term of this patent is extended or adjusted under 35 U.S.C. 154(b) by 109 days.

(21) Appl. No.: 18/400,021

(22) Filed: Dec. 29, 2023

(65) Prior Publication Data

US 2025/0220835 A1 Jul. 3, 2025

(51) Int. Cl.
H05K 5/03 (2006.01)
A45F 5/00 (2006.01)
H05K 5/06 (2006.01)

(52) U.S. Cl.
CPC ................. H05K 5/03 (2013.01); A45F 5/00 (2013.01); H05K 5/06 (2013.01); A45F 2005/008 (2013.01)

(58) Field of Classification Search
CPC ......... A45F 2005/008; A45F 2003/008; A45C 1/04; G09F 3/005; H05K 5/03; H05K 5/06
See application file for complete search history.

(56) References Cited

U.S. PATENT DOCUMENTS

| | | | | |
|---|---|---|---|---|
| 2,073,280 | A * | 3/1937 | Lederer ................ | A44C 5/0015 |
| | | | | 63/3 |
| 5,360,130 | A * | 11/1994 | Lehmann ................. | H02G 3/14 |
| | | | | 220/792 |
| 7,174,605 | B1 * | 2/2007 | Nawrocki .............. | A45C 13/28 |
| | | | | 16/428 |
| 9,591,913 | B2 * | 3/2017 | Kim .......................... | H02J 7/35 |
| 9,770,088 | B1 * | 9/2017 | Rivers ....................... | A45F 5/00 |
| 10,477,932 | B2 * | 11/2019 | Bouganim ................ | A45F 5/00 |
| 11,737,550 | B2 * | 8/2023 | Williamson .............. | F16B 2/20 |
| | | | | 24/3.2 |
| 2011/0179686 | A1 * | 7/2011 | Morehouse ............. | G09F 3/005 |
| | | | | 40/633 |
| 2013/0056612 | A1 * | 3/2013 | Cheng ..................... | E05B 15/02 |
| | | | | 248/674 |
| 2014/0103082 | A1 * | 4/2014 | Schaller ................. | B65D 75/52 |
| | | | | 224/191 |
| 2018/0365548 | A1 * | 12/2018 | Karani ..................... | G09F 3/005 |
| 2022/0047059 | A1 * | 2/2022 | Romiti ................... | A45D 33/33 |
| 2022/0104917 | A1 * | 4/2022 | Pollack ................... | G09F 3/185 |

* cited by examiner

*Primary Examiner* — Adam J Waggenspack
(74) *Attorney, Agent, or Firm* — Renner, Kenner, Greive, Bobak, Taylor & Weber

(57) ABSTRACT

A location tag housing for retaining a location tag including a base, a cover adapted to be positioned on and attachable the base, the base and the cover defining a receptacle for retaining the location tag, wherein the base and cover defining a smooth and seamless structure when the cover is attached to the base.

21 Claims, 5 Drawing Sheets

LOCATION TAG HOUSING

TECHNICAL FIELD

The present invention relates to a location tag housing for retaining a location tag.

BACKGROUND

Location tags are used to identify people. Location tags for example, electronic location tags are commonly used in hospitals e.g., Accident and Emergency Departments (AEDs) to track the location of a patient. Hospitals and other medical facilities have patient tracking systems to track the location of patients. These tracking systems generally include multiple tags, each tag (patient tag) being worn by a patient. The patient tag is associated with a patient such that the tag can be used to identify a particular patient. Each patient tag is detected by an appropriate sensor and multiple sensors located around the hospital.

If a patient leaves the hospital or a designated area without authorisation, the system can detect this based on detecting the appropriate patient tag location and generate an alert. This system allows efficient patient management as there does not need to a staff member manually observing patients. The automated patient monitoring electronic tags provides an automated monitoring system that can generate alerts when a patient has entered an unauthorised area or left the building.

Patients in hospital wear a bracelet with an identifier (ID) e.g., a QR code that is disposed on the bracelet. The electronic tag is often disposed on the bracelet itself. This can be uncomfortable for a patient. Further the tag being disposed on the bracelet makes it difficult to securely retain the tag. The tag can fall off or get damaged as it is often exposed. Patients can also tamper with these tags when they are located on the bracelet. These tags also need to be biocompatible to avoid any toxicity or skin damage or skin irritation or discomfort for the patient to improve patient compliance. Generally, several patients are hesitant or resistant to wearing these electronic tags.

SUMMARY OF THE INVENTION

In accordance with a first aspect, there is provided a location tag housing for retaining a location tag comprising:

a base, a cover adapted to be positioned on and attachable the base, the base and the cover defining a receptacle for retaining the location tag, wherein the base and cover defining a smooth and seamless structure when the cover is attached to the base.

In one example the location tag housing further comprising:

a first slot and a second slot formed in the base at opposing sides of the base, wherein each slot is shaped to receive a strap through it, wherein the first slot and second slot are identical is size and shape to each other.

Optionally, the tag housing may comprise a strap e.g., a medical bracelet that is looped through each slot.

In one example each slot is an elongate slot that is formed coaxially along a longitudinal axis of the base, and wherein the base is rectangular in shape.

In one example the cover is removably attachable to the base, and the cover configured to snap fit to the base and the snap fit connection is secure enough to avoid accidental disassembly.

In one example the tag housing is 4 cm×4 cm×1.1 cm in size, with a volume of 17.6 cm³.

In one example wherein the base comprises a rim extending outwardly from the base, the cover is a rectangular prism shape, and wherein the cover comprises: five faces and an open bottom enclosed by a connecting edge, a space defined by the five faces and the connecting edge, and; wherein the connecting edge is configured to snap fit with the rim of the base when the cover is positioned on and attached to the base.

In one example wherein rim comprises a plurality of laterally extending bumps, the connecting edge or one or more inner faces of the cover comprises one or more cut outs, the cut outs having a complementary shape to the bumps, and, wherein the bumps are deflected and received into the cut outs when the cover is snap fitted onto the base.

In one example the rim comprises four bumps, two bumps located along one longitudinal portion of the rim and two bumps on an opposing longitudinal portion of the rim, the two bumps on each longitudinal portion being spaced apart from each other.

In one example the housing is structured to prevent liquid ingress at IP63 standard. In one example the housing when the cover is attached to the base, the assembly is structured to prevent liquid ingress to at least an IP63 standard.

In one example the snap fit between the base and cover is adapted to prevent liquid ingress at IP63 standard. In this example, the joint i.e., the snap fit may be substantially tight and is structured to prevent water ingress to at least the IP63 standard.

Optionally, the rim may comprise a resilient seal disposed on the rim. The seal is configured to seal against the cover when the cover is attached to the cover. The seal may be adapted to form a seal at the snap fit connection between the cover and base.

In one example wherein the cover and base are formed from a material that:

complies with biocompatibility requirements defined in ISO10993, is functional within a temperature range of −20° C. to 80° C., withstands cleaning with one or more of UV light, alcohol-based sanitizers, and bleach solution, is electrically insulative, comprises antimicrobial properties to inhibit bacterial growth.

In one example wherein one or both of the cover and base are formed from a material that is impact resistant up to 250 J/m².

In one example the cover and the base are formed from a material that is nonporous which facilitates easy cleaning and reduces microbe attachment.

In one example the location tag housing comprises a label adhered to a top surface of the cover by adhesive, wherein the adhesive comprises a peel adhesion of up to 704 N/m or 4 lbs./in., and wherein the label is a polyester label.

In one example wherein the base is 4 cm long and 4 cm wide, the cover is 4 cm long and 3 cm wide, and the rim is 4 cm long and 2 cm wide.

In one example wherein the rim defines a rectangular shape that is complementary to the shape of the connecting edge, and wherein length and width of the connecting edge is greater than the length and width of the rim such that the connecting edge snap fits around the outside of the rim.

In one example wherein the rim defines a rectangular shape that is complementary to the shape of the connecting edge, and wherein length and width of the connecting edge is less than the length and width of the rim such that the connecting edge snap fits around the inside of the rim.

In one example the location tag housing is configured to receive and retain an electronic tag, battery, and internal PCB, and wherein the housing is less than 12 g in weight.

In one example wherein the cover comprises rounded edges and rounded corners to define a smooth and seamless structure.

In one example the cover comprises a matte silver polyester QR label print. The polyester label may meet industry standards of durability, moisture resistance, thermal stability and print quality.

In one example, the strap may comprise one or more identifiers such as a QR code that is printed onto the strap. The strap is formed from a material that meets biocompatibility requirements defined in ISO10993. The strap may further comprise a sheath e.g., a plastic laminate that encases the strap. The cover may comprise a casing of a medical grade plastic, wherein the casing may encase the outer surface of the cover and protect a label disposed on the outer surface of the cover.

The term "comprising" (and its grammatical variations) as used herein are used in the inclusive sense of "having" or "including" and not in the sense of "consisting only of".

It is to be understood that, if any prior art information is referred to herein, such reference does not constitute an admission that the information forms a part of the common general knowledge in the art.

BRIEF DESCRIPTION OF THE DRAWINGS

Embodiments of the present invention will now be described, by way of example, with reference to the accompanying drawings in which.

DETAILED DESCRIPTION OF THE PREFERRED EMBODIMENTS

The present invention relates to a location tag housing for receiving and retaining an electronic location tag. The location tag housing is particularly suited for use in hospitals, nursing homes, general practices or medical facilities as a patient tag for identification of a patient and tracking the location of the patient. Alternatively, the location tag housing may be used for other applications where a person needs to be identified.

An electronic location tag is commonly used in hospitals for identifying and location tracking of patients. The electronic location tag may be defined as a patient tag herein, since the described location tag housing and location tag are described in the example application of use in a hospital for patient identification and location tracking.

Hospitals commonly use location tags for identifying patients and tracking the location of these patients as they move around the hospital. The Accident and Emergency Department (AED) is one of the most common environments where location tags are used for patient identification and patient location tracking. These location tags are electronic tags such as for example a RFID tags or Bluetooth Low Energy (BLE) tags. These electronic tags generally comprise a battery, the tag including a transmitter and interfacing circuitry all disposed on a PCB.

Figure 1:
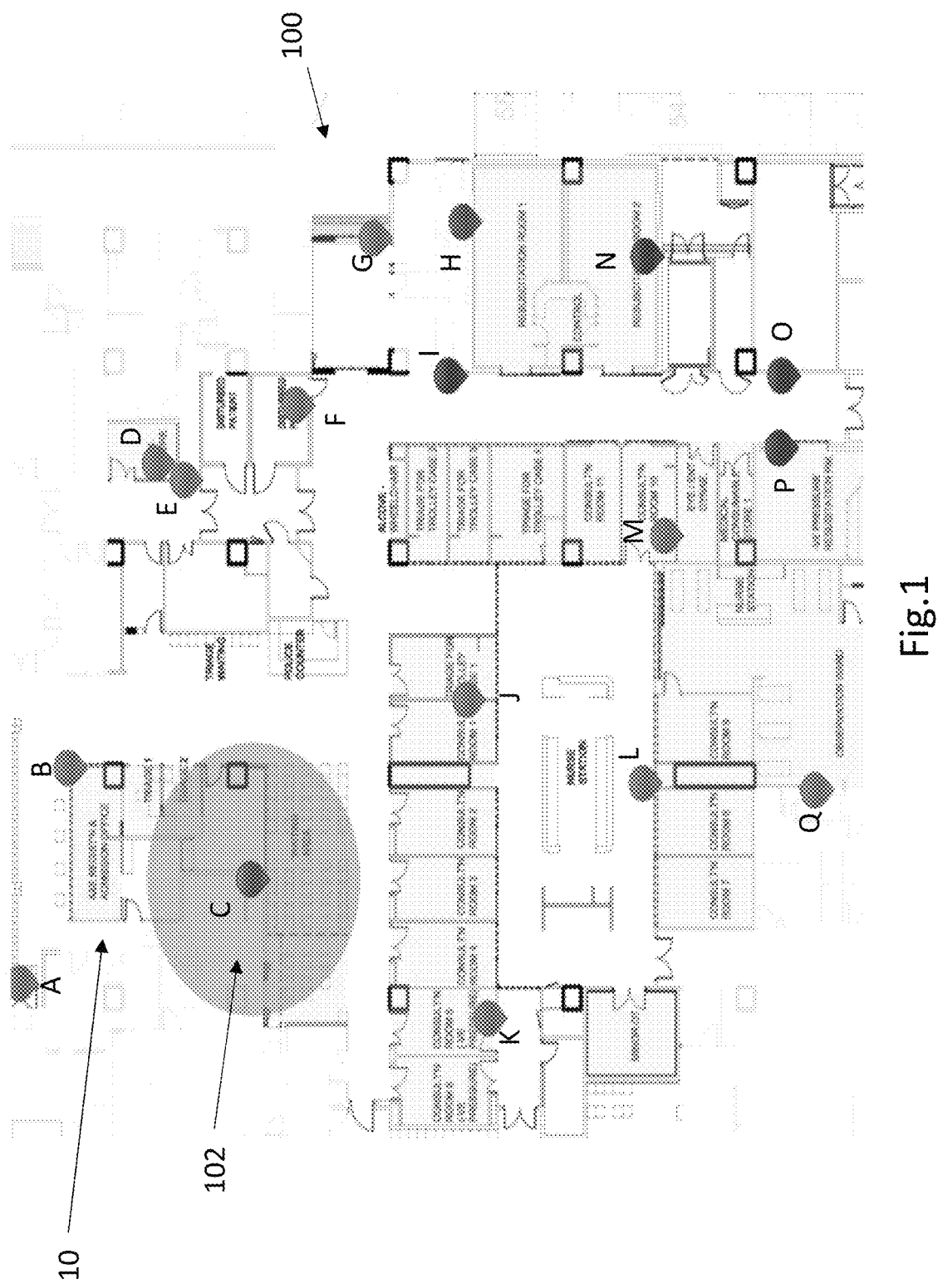
FIG. 1 illustrates example schematic of a hospital AED with a monitoring system that uses location tags (user tags) and multiple sensors located within the hospital AED.

A hospital can implement a patient monitoring system using location tags and sensors. FIG. 1 illustrates an example patient monitoring system 100. The monitoring system 100 in the hospital generally comprises multiple sensors disposed within it, and the sensors are configured to detect a particular tag. The sensors may be attached to a wall and may have a large detection area, for example 18,000 square meters. These sensors may be appropriate sensors, that can sense a patient tag and estimate the location of the tag.

FIG. 1 illustrates example schematic of a hospital AED 10 with a monitoring system 100 and multiple sensors located within the hospital AED 10. In the illustrated example, the monitoring system 100 comprises seventeen sensors A to Q. The sensors are configured to detect one or more electronic location tags. The sensors A-Q may be electronically coupled to a processing unit e.g., a server (not illustrated) that is configured to identify a patient and determine the location of the patient based on the location of the electronic location tag worn by the patient.

The server may be configured to generate alerts or alarms if a patient is detected in an unauthorised area or if a patient leaves a designated area based on detecting the location of the electronic location tag.

The patient location is estimated based on the detected tag location. The location of the patient is detected by tracking the location of the associated patient tag. An alert is generated and displayed if a patient leaves a designated area, e.g., if a patient leaves the AED without authorisation. This can be detected by tracking the location of the patient. The system may be configured to provide a notification to the mobile devices of the duty staff. Each sensor has a sensing zone. As shown in FIG. 1, the sensor C has a sensing zone 102. Each sensor can detect one or more location tags that enter the sensing zone of the sensors. The detected sensors are transmitted to the processing unit (server) for processing and identification.

In an example embodiment, the processing unit (server) may be implemented by a computer having an appropriate user interface. The server may be implemented by any computing architecture, including portable computers, tablet computers, stand-alone Personal Computers (PCs), smart devices, Internet of Things (IoT) devices, edge computing devices, client/server architecture, "dumb" terminal/mainframe architecture, cloud-computing based architecture, or any other appropriate architecture. The computing device may be appropriately programmed to implement the functions of detecting a location tag, identifying an associated patient, detecting the current location of the identified patient, and tracking the location of the identified patient. The server may be configured to identify multiple patients and track their locations.

The location tag is retained in a location tag housing. In one example form, the location tag housing comprises: a base, a cover adapted to be positioned on and attachable the base, the base and the cover defining a receptacle for retaining the location tag, and wherein the base and cover defining a smooth and seamless structure when the cover is attached to the base. The housing may further comprise first slot and a second slot formed in the base at opposing sides of the base, wherein each slot is shaped to receive a strap through it, and wherein the first slot and second slot are identical is size and shape to each other. The cover is removably attachable to the base, and the cover configured to snap fit to the base and the snap fit connection is secure enough to avoid accidental disassembly.

Figures 2, 3, 4:
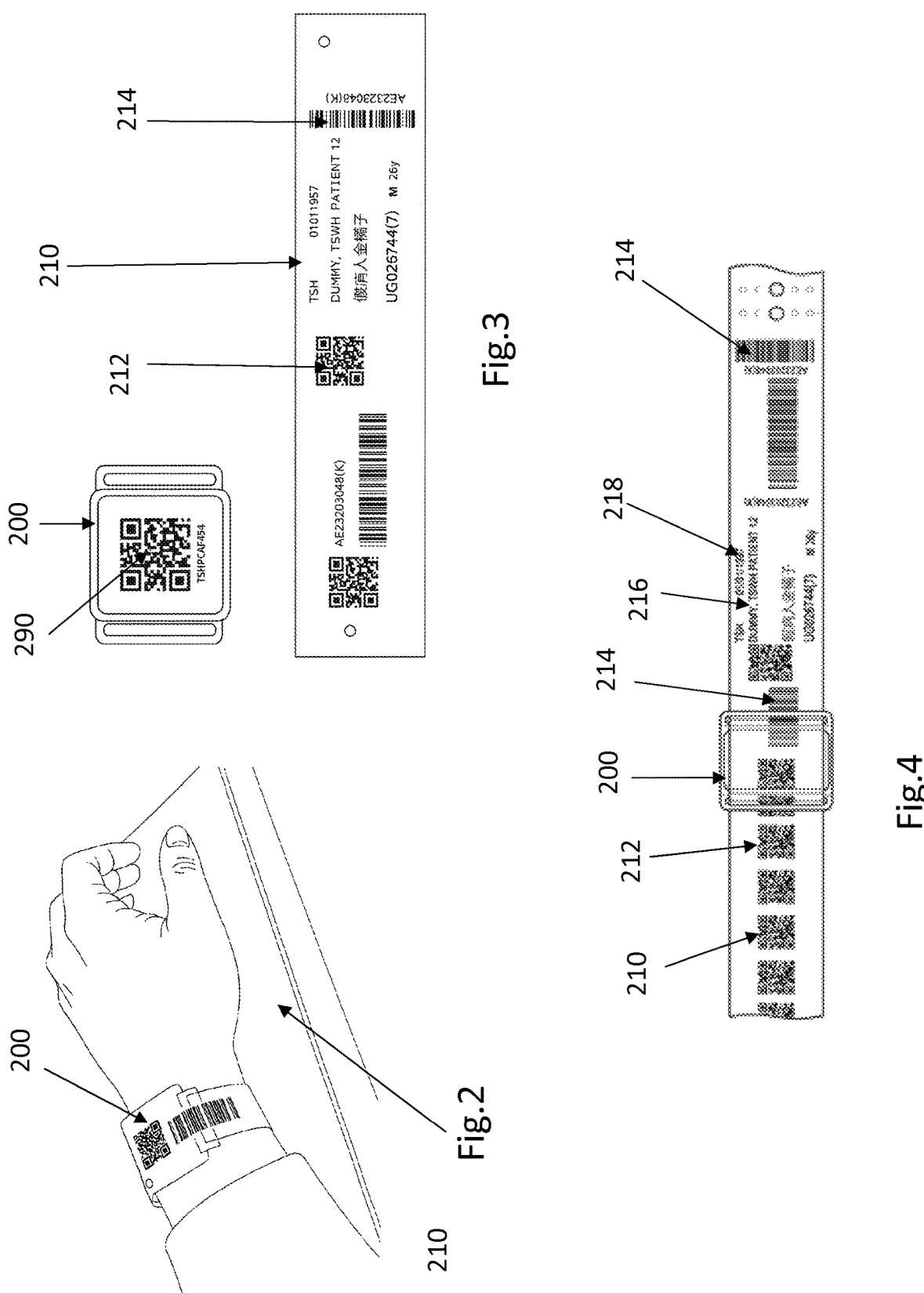
FIG. 2 illustrates a location tag housing in use on a wrist of a user.
FIG. 3 illustrates a location tag housing and strap separately.
FIG. 4 illustrates the strap attached to a location tag housing.

Referring to FIG. 2, FIG. 3 and FIG. 4 there is illustrated an example of a location tag housing 200 for retaining a location tag 300. The location tag housing 200 may be worn by a patient on their wrist as shown in FIG. 2 by looping a strap 210 e.g., a medical bracelet through the housing. The strap 210 may be wrapped around the wrist. The location tag housing 200 may be positioned on outer portion of a user's wrist when in an operative position and secured in the operative position by the strap 210.

The strap 210 may be a medical bracelet. The strap may comprise one or more one or more identifiers such as a QR code 212 that is printed onto the strap, as shown in FIG. 3 and FIG. 4. The strap may comprise an additional barcode 214 printed thereon. The QR code and barcode may store a patient identifier that allows identification of the patient by scanning the QR code 212 or barcode 214. A patient's name 216, date of birth 218 and other information may also be printed on the strap. As shown in FIG. 3 the location tag housing 200 may also include a QR code disposed on a top surface of the housing 200. The QR code and/or barcode may have encoded patient data or may include an address to the appropriate patient medical records. The medical records for a specific patient may be accessed by scanning the QR code on the strap 210 of that patient.

The strap 210 may be formed from a material that meets biocompatibility requirements defined in ISO10993. The strap 210 may further comprise a sheath e.g., a plastic laminate that encases the strap.

Figures 5, 6:
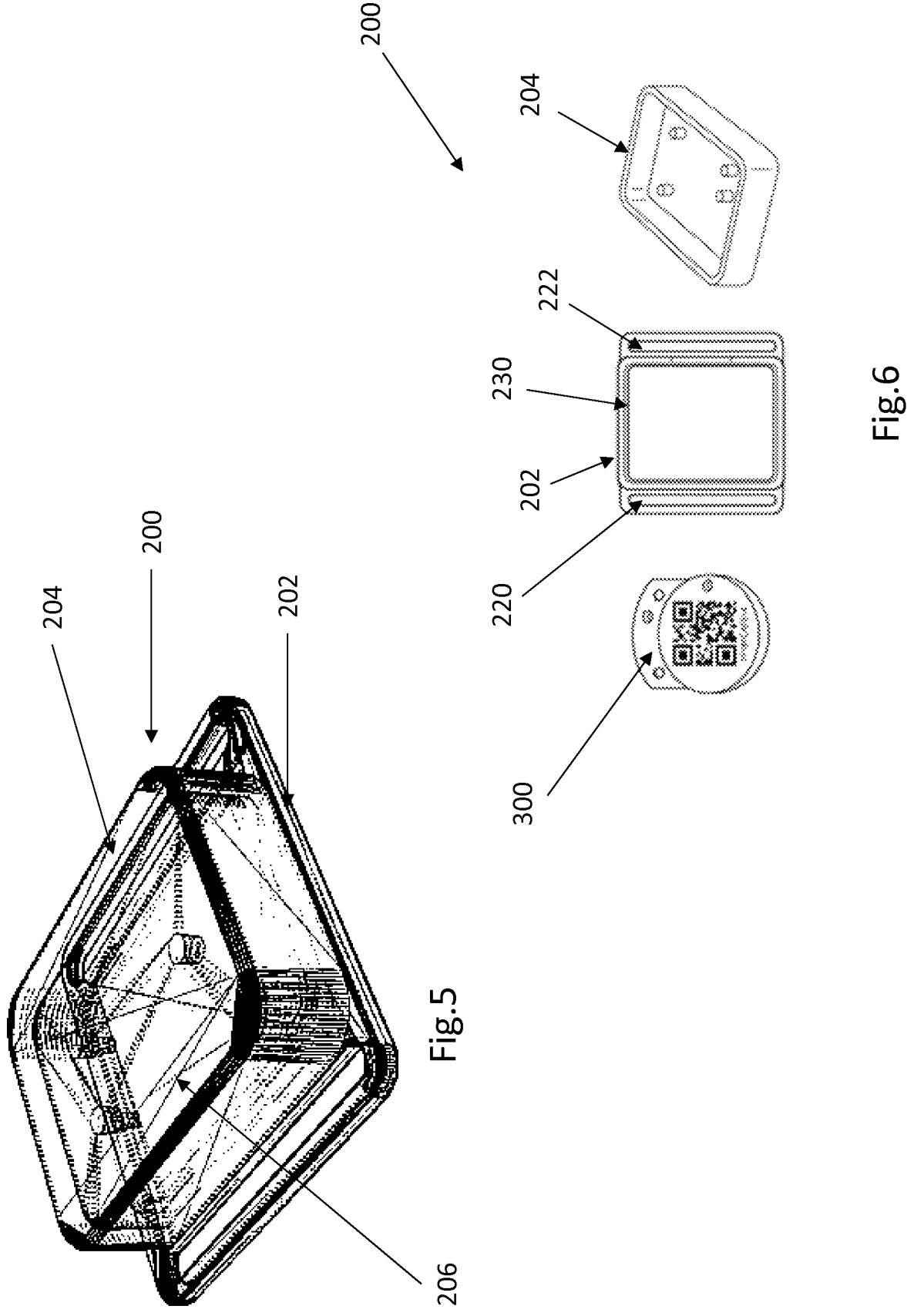
FIG. 5 illustrates perspective view of a location tag housing for retaining an electronic location tag.
FIG. 6 illustrates a disassembled location tag housing, the components of a location tag housing and a location tag that is retained within the housing.

FIG. 5 illustrates an example of the location tag housing when in an assembled configuration. FIG. 6 illustrates an example of the disassembled location tag housing 200, and the location tag 300. The location tag 300 may comprise an electronic tag e.g., an RFID tag or a Bluetooth Low Energy (BLE) tag. The location tag 300 may be any suitable transmitting tag configured to transmit signals. The transmitted signals can be detected to identify the location of the tag, tag housing 200 and associated patient. The location tag 300 comprises a transmitter to transmit signals, a battery and interfacing circuitry, all placed on a PCB. The tag 300 shown in FIG. 6 may an integrated circuit or a package of the components. The location tag housing 200 is configured to receive and retain the tag within it when in an assembled configuration, as shown in FIG. 5. The tag 300 may be a medical tag that is configured to store a patient's medical device. The tag can be used for patient location tracking, but also may be used to store medical information and transmit medical information as required.

In one example, as shown in FIG. 6, the location tag 300 (patient tag or medical tag) may also include a QR code 302 or an optical code disposed on it. The optical code 302 may be the same as the QR code 212 on the strap. Alternatively, the optical code 302 (QR code) on the tag may be a unique code associated with the tag. The system 100 may undergo a calibration phase where the specific location tag 300 may be associated with (i.e., linked to) a particular patient by scanning the tag 300 and scanning the QR code 212 on the strap. An appropriate scanning device can be used, the association may be stored within the server or patient medical records or in a hospital's patient management system.

The location tag housing for retaining a location tag comprises a base 202 and a cover 204 adapted to be positioned on and attachable the base. The base 202 and the cover 204 define a receptacle 206 for retaining the location tag 300 therein. The base 202 and cover 204 define a two-part assembly. The base 202 and cover 204 define a smooth and seamless structure when the cover is attached to the base.

The location tag housing 200 further comprises a first slot 220 and a second slot 222 formed in the base 202 at opposing sides of the base. As shown in FIG. 6, FIG. 7, FIG. 9 and FIG. 10, the slots are defined in opposing sides of the base 202. Each slot 220, 222 is shaped to receive a strap 210 (bracelet) through it. Each slot 220, 222 is identical in size and shape to each other. Optionally, the tag housing 200 may comprise a strap e.g., a medical bracelet that is looped through each slot 220, 222.

Figures 9, 10, 11, 12:
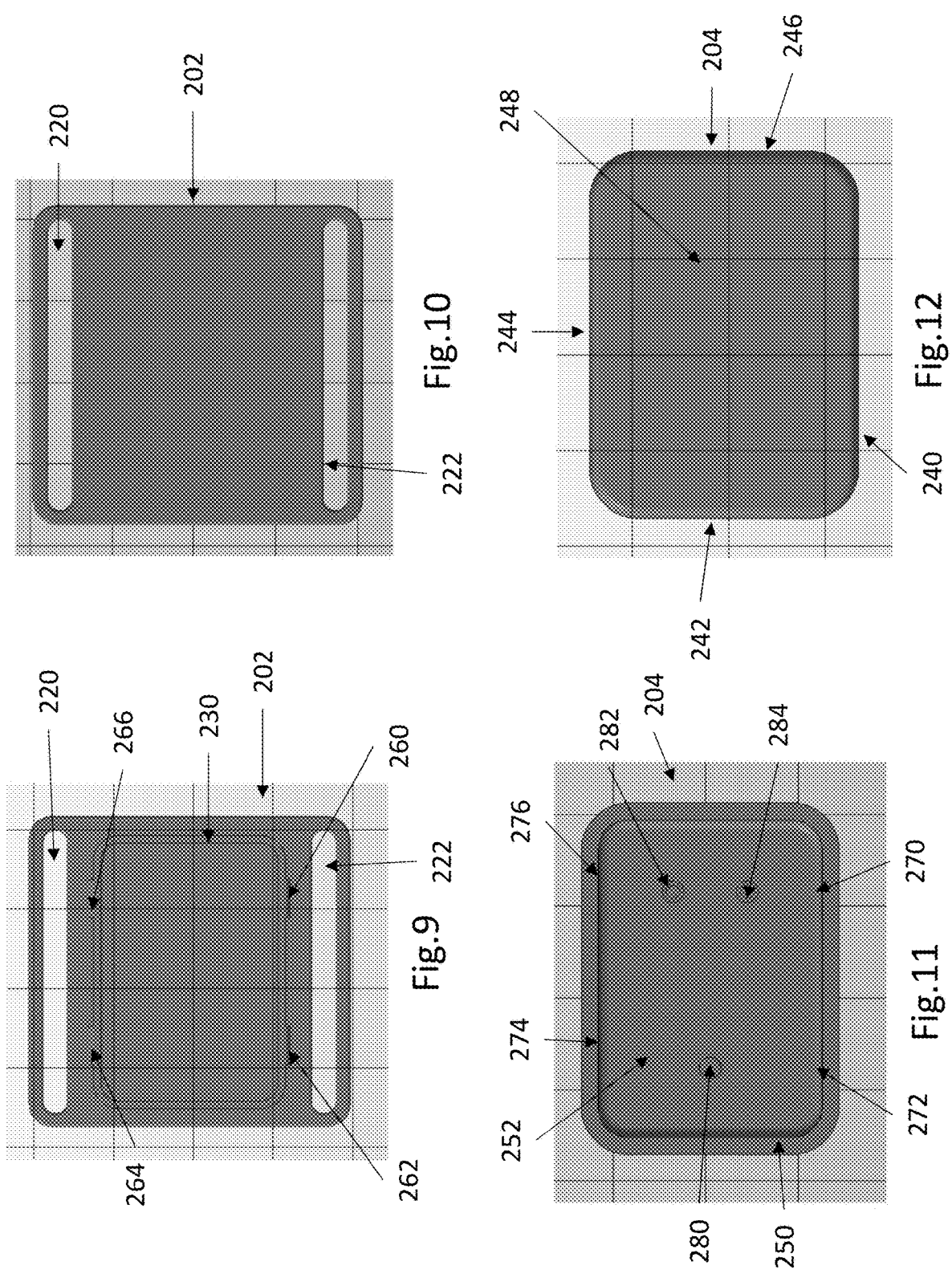
FIG. 9 illustrates the base and inner face of the location tag housing when viewed from the top.
FIG. 10 illustrates the base and bottom face of the location tag housing when viewed from the bottom.
FIG. 11 illustrates the cover of the location tag housing when viewed from the bottom, illustrating the inner face of the cover.
FIG. 12 illustrates the cover of the location tag housing when view from the top illustrating the top face.

Each slot 220, 222 is an elongate slot that is formed coaxially along a longitudinal axis of the base, and wherein the base is rectangular in shape. As shown in FIGS. 9 and 10, the slots are elongate in shape and extend parallel to a longitudinal axis of the base. As shown in FIG. 9, the slots 220, 222 extend parallel to the longitudinal axis of a rim 230 (or lip) on the base.

The cover 204 is removably attachable to the base, and the cover configured to snap fit to the base and the snap fit connection is secure enough to avoid accidental disassembly. The base 202 comprises a rim 230 extending outwardly from the base. The snap fit mechanism is advantageous as it eliminates the need for screws or clamps or clips. The snap fit connection also allows for easy disassembly and assembly to allow cleaning of the housing, recycling of the housing and/or replacement of the electronic tag in the housing. The snap fit allows a human to disassemble the housing using their hands rather than having to rely on using screw drivers or other tools. This makes use fast and easy, especially in a busy environment such as a hospital. The housing 200 can be easily disassembled and reassembled by nurses, and the snap fit is tight enough to be robust during use and avoid accidental disassembly. FIG. 5 illustrates an assembled form of the housing 200, where the cover 204 is placed on and snap fitted to the base 202. The cover 204 and base 202 when snap fitted define a receptacle 206 to retain the tag 300.

Figures 7, 8:
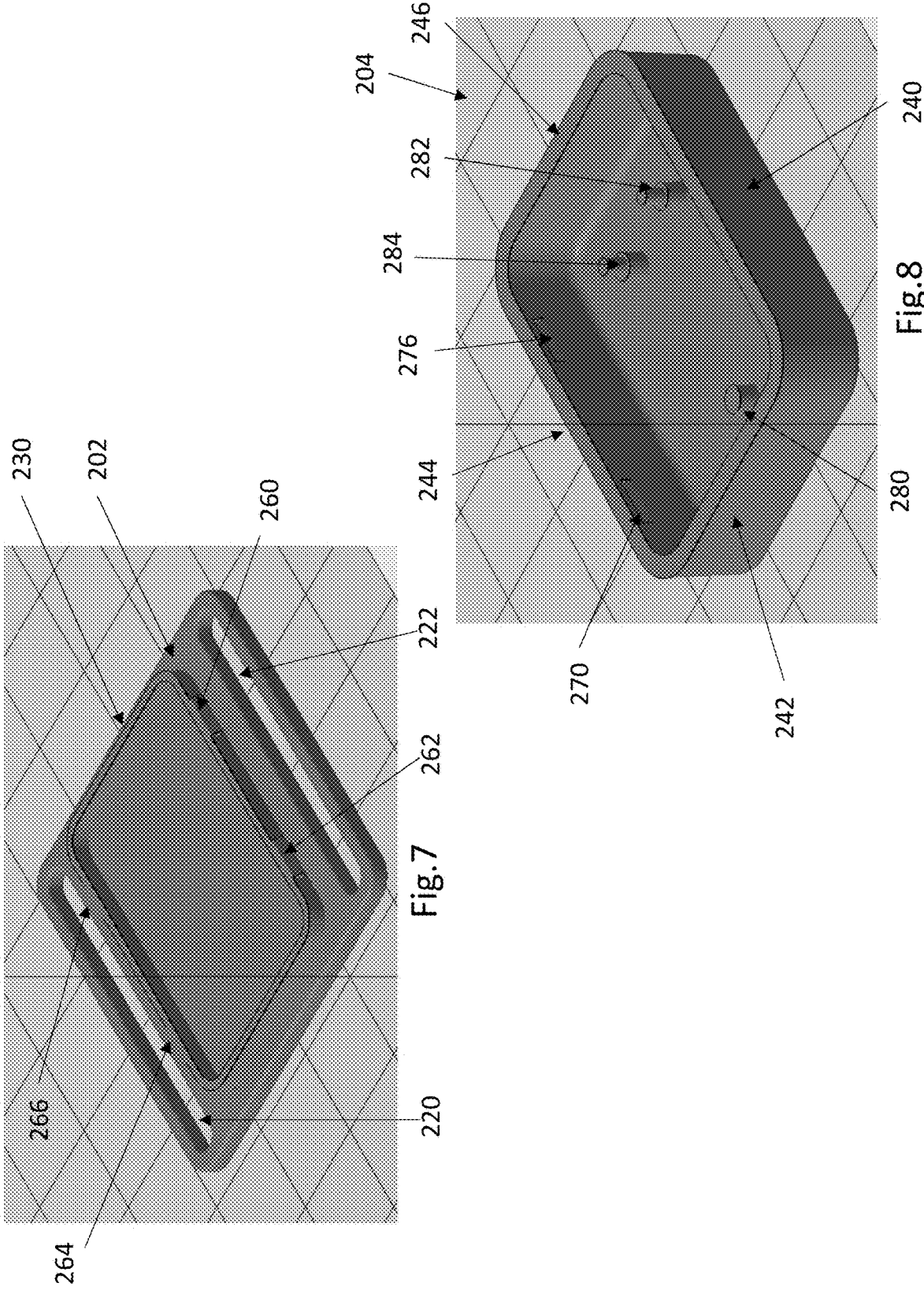
FIG. 7 illustrates a perspective view of a base of a location tag housing.
FIG. 8 illustrates a perspective view of a cover of a location tag housing.

The base 202 comprises a rim 230 extending outwardly from the base. The rim 230 may be a polygon shaped rim. In one example the rim 230 is a rectangular shape. The cover 204 is a rectangular prism. The cover 204 comprises five faces 240, 242, 244, 246, 248 and an open bottom enclosed by a connecting edge 250, as shown in FIG. 8 and FIG. 12. A space 252 defined by the five faces 240-248 and the connecting edge 250, as shown in FIG. 8 and FIG. 11. The space 252 forms the receptacle to retain an electronic tag. The connecting edge 250 is configured to snap fit with the rim 230 of the base when the cover 204 is positioned on and attached to the base 202.

In one example configuration the rim 230 defines a rectangular shape that is complementary to the shape of the connecting edge 250. In this example the length and width of the connecting edge 250 is greater than the length and width of the rim 230. The connecting edge may be only slightly larger than the rim 230 such that the connecting edge 250 snap fits around the outside of the rim 230.

In another example configuration the rim 230 defines a rectangular shape that is complementary to the shape of the connecting edge 250. In this configuration the length and width of the connecting edge 250 is less than the length and width of the rim 230. The connecting edge is only slightly smaller than the rim 230 such that the connecting edge snap fits around the inside of the rim 230.

The connecting edge 250 snap fits to the rim 230 (or lip) by deforming slightly as the cover 204 is pushed onto the base 202. The snap is caused by the mechanical deflection of the connecting edge 250 by the raise rim 230 (or lip).

In one example the rim 230 comprises a plurality of laterally extending bumps 260, 262, 264, 266. FIG. 7 and FIG. 9 illustrate the rim 230 comprising four bumps 260-266, and a pair of bumps is located on each longitudinal length of the rim 230, as shown in FIG. 7 and FIG. 9. The bumps 260-266 protrude laterally outward from the rim 230 and are used for connecting to complementary connecting structures on the cover. The bumps engage the complementary connecting structures to form a snap fit.

The snap fit mechanism is advantageous because it makes the tag housing 200 reusable since the cover 204 can be disconnected from the base 202 easily and reattached easily. The snap fit can be attached and removed by a nurse, but the snap fit is strong enough to prevent accidental dislodgement of the cover. The snap fit attachment makes the tag housing 200 reusable as the housing 200 can be disassembled and the electronic tag may be replaced or serviced easily and quickly.

Further the cover and base don't require screws or other couplers to retain them together, since the cover and base are retained by the snap fit. This is advantageous as it allows fast disassembly and reassembly of the cover and base without the need for tools. This makes servicing of the electronic tag or other electronics efficient. It also allows nurses or other non-technical staff to disassemble and reassemble the tag housing 200. No screws or couples is also advantageous because it reduces any potential liquid ingress points, bacterial ingress points, or stress concentration points.

The entire tag housing 200 is a smooth and seamless structure. The snap fit also reduces any holes or openings where bacteria or microbes can grow making this housing safe and suitable for hospital or medical use. The cover comprises rounded edges and rounded corners defining a smooth and seamless structure. The base also comprises rounded edges and rounded corners defining a smooth and seamless structure. The tag housing 200 has a smooth and seamless structure without gaps or holes with prevents dust or bacterial infiltration. The smooth surfaces of the tag housing 200 (and cover and base) are advantageous as they reduce risk of sharp or rough edges that may cause discomfort or injury to a patient.

The connecting edge 250 or one or more inner faces of the cover 204 comprises one or more cut outs. As shown in FIG. 8 and FIG. 11, the cover 204 comprises four cut outs 270, 272, 274, 276. The cut outs 270-276 have a complementary shape to the bumps 260-266. Two cut outs are formed in each longitudinal face of the cover 204. The bumps 260-266 are deflected and received into the cut outs 270-276 when the cover is snap fitted onto the base 202. Each cut out receives one bump, and the bump is retained in each cut out to form the snap fit.

The cover 204 may comprise a plurality of locating posts. As shown in FIG. 8 and FIG. 11, an inner surface of the top face 248 comprises three posts 280, 282, 284. The three locating posts 280-284 extend outward. The locating posts may be used to locate around the electronic tag 300. The posts 280, 282, 284 hold the tag 300 within the receptacle 206 once the cover 204 is snap fitted to the base 202.

In one example the tag housing 200 is 4 cm×4 cm×1.1 cm in size, with a volume of 17.6 cm³. In one example wherein the base 202 is 4 cm long and 4 cm wide and the cover 204 is 4 cm long and 3 cm wide. In this example the rim 230 is 4 cm long and 2 cm wide. The tag housing may have any other suitable form factor. The strap 210 may be wide enough to fit into the slots 220, 222, and can have any suitable length.

In one example the tag housing 200 is structured to prevent liquid ingress at IP63 standard. In one example when the cover 204 is attached to the base 202, the assembly is structured to prevent liquid ingress to at least an IP63 standard. The snap fit between the base 202 and cover 204 is adapted to prevent liquid ingress at IP63 standard. In this example, the joint i.e., the snap fit may be substantially tight and is structured to prevent water ingress to at least the IP63 standard.

Optionally, the rim may comprise a resilient seal disposed on the rim. The seal is configured to seal against the cover when the cover is attached to the cover. The seal may be adapted to form a seal at the snap fit connection between the cover and base.

The tag housing 200 may be formed from a biocompatible material. In one example the cover 204 and base 202 are formed from a material that complies with biocompatibility requirements defined in ISO10993. The cover 204 and base 202 may be formed from a biocompatible material such as, a medical grade plastic (e.g., polycarbonate) or silicone or other suitable material. The material would pass all the requirements for biocompatibility e.g., cytotoxicity, systemic toxicity, pyrogen tests and intracutaneous tests.

The material for the tag housing 200 (i.e., cover and base) is functional within a temperature range of −20° C. to 80° C. The material of the tag housing 200 is suitable to withstand cleaning with one or more of UV light, alcohol-based sanitizers, and bleach solution without breaking down or damage. The material of the tag housing 200 is electrically insulative, to reduce any electrical interference with the electronic tag within the housing 200. The electrical insulation reduces chances of errors in detecting the tag location. The material of the tag housing 200 comprises antimicrobial properties to inhibit bacterial growth. In one example the tag housing i.e., both cover and base are formed from a material that is impact resistant up to 250 J/m². The housing 200 is durable and impact resistant making it robust and suitable for use on many patients. In one example the cover 204 and base 202 are formed from a material that is nonporous which facilitates easy cleaning and reduces microbe attachment. The housing 200 is formed from a material that is non porous, which reduces microbe attachment.

The tag housing 200 (and its components) are formed from a medical grade material that has all the properties described above. This makes the tag housing 200 advantageous and particularly suitable for use in hospitals and other medical environments on patients. The material of the tag housing 200 is a robust material that is biocompatible, reduces microbe growth and can operate in all environmental conditions of a hospital or medical facility.

In one example the location tag housing 200 is configured to receive and retain an electronic tag, battery, and internal PCB. The housing is less than 12 g in weight. This is advantageous because it makes the housing 200 comfortable to wear on the wrist of patients. The material properties, the shape (i.e., smooth, and seamless design) and the lightweight of the tag housing 200 make it comfortable to wear for a patient. This improves compliance by patients, and ensures patients are more likely to wear the tag housing. This makes location tracking and/or identification of patients simpler for hospital staff and improves patient management in hospitals or medical facilities. The location tag housing 200 described herein may be used in other environments where location tracking of people is important.

In one example the location tag housing 200 comprises a label adhered to a top surface of the cover by adhesive. The adhesive comprises a peel adhesion of up to 704 N/m or 4 lbs./in. The label is a polyester label. The polyester label is used because it meets the industry standards such as durability, moisture resistance, thermal stability and print quality. Polyester labels used on the housing 200 are suitable for use in medical facilities.

In one example the cover 204 comprises a matte silver polyester QR label print. A label 290 e.g., a polyester with a QR code (or other optical code) may be adhered to the top surface 248 of the cover 204, as shown in FIG. 3. The QR code on label 290 may correspond to a patient. Alternatively, the QR code 290 may correspond to the specific location tag housing 200 and may be used to identify the specific housing. The QR code 290 may be used for inventory management where each tag housing 200 can be identified based on the unique QR code associated with the housing. The label may have a peel adhesion of 704 N/m. Alternatively, the QR code on the cover 204 may be used to identify a patient. A new label may be printed for each new patient that uses the tag housing 200. The label has a sufficient peel strength to prevent patients or other users from peeling off the label, and to prevent the label being ripped off or peeled off during normal use of the tag housing.

In an alternative configuration the location tag housing 200 may comprise tamper proof features. The cover 204 and base 202 may form a one time snap fit, i.e., a single snap fit. The tamper proof features can indicate if a user has tried to remove or break the snap fit connection. The tamper proof features may be visual indicators that indicate that a user e.g., a patient has tried to remove the cover from the base and break the snap fit connection.

The location tag housing 200 is advantageous due to its material properties, smooth and seamless shape, and snap fit mechanism. The location tag housing 200 is suited for medical use due to its various features described herein. The location tag housing 200 may be used in other industries or instances where a user location tracking is needed.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Any reference to prior art contained herein is not to be taken as an admission that the information is common general knowledge, unless otherwise indicated.

One or more of the components and functions illustrated the figures may be rearranged and/or combined into a single component or embodied in several components without departing from the scope of the invention. Additional elements or components may also be added without departing from the scope of the invention.

The invention claimed is:

1. A location tag housing for retaining a location tag comprising:
   a base,
   a cover defining a connecting edge, and is adapted to be positioned on and attachable the base to form a snap fit at the connecting edge,
   the base and the cover defining a receptacle for retaining the location tag, and
   a pair of slots shaped to receive a strap therethrough to facilitate wearing of the location tag by a user,
   wherein the base comprises a rim which defines a shape that is complementary to the shape of the connecting edge,
   wherein the base and cover defining a smooth and seamless structure when the cover is attached to the base,
   wherein the rim comprises a plurality of laterally extending bumps, and the connecting edge or an inner face of the cover comprises one or more cut outs having a complementary shape to the bumps;
   wherein the connecting edge is configured to snap fit with the rim of the base when the cover is positioned on and attached to the base such that the bumps are deflected and received into the cut outs, and
   wherein the snap fit formed by the engagement of the bumps and the cut outs between the base and the cover is substantially tight such that the housing is structured to prevent liquid ingress without a gasket.

2. The location tag housing of claim 1, wherein the pair of slots include
   a first slot and a second slot formed in the base at opposing sides of the base, wherein each slot is shaped to receive a strap through it, and
   wherein the first slot and second slot are identical is size and shape to each other.

3. The location tag housing of claim 2, wherein each slot is an elongate slot that is formed coaxially along a longitudinal axis of the base, and wherein the base is rectangular in shape.

4. The location tag housing of claim 2, wherein the cover is removably attachable to the base, the snap fit is secure enough to avoid accidental disassembly.

5. The location tag housing of claim 4, wherein the tag housing is 4 cm×4 cm×1.1 cm in size, with a volume of 17.6 cm³.

6. The location tag housing of claim 4:
   wherein
   the cover is a rectangular prism shape,
   wherein the cover comprises:
   five faces and an open bottom enclosed by the connecting edge, and
   a space defined by the five faces and the connecting edge.

7. The location tag housing of claim 1, wherein the rim comprises four bumps, two bumps located along one longitudinal portion of the rim and two bumps on an opposing longitudinal portion of the rim, the two bumps on each longitudinal portion being spaced apart from each other.

8. The location tag housing of claim 7, wherein the housing is structured to prevent liquid ingress at IP63 standard.

9. The location tag housing of claim 6, wherein the cover and base are formed from a material that:

complies with biocompatibility requirements defined in ISO10993, is functional within a temperature range of −20° C. to 80° C., withstands cleaning with one or more of UV light, alcohol-based sanitizers, and bleach solution, is electrically insulative, comprises antimicrobial properties to inhibit bacterial growth.

10. The location tag housing of claim 9, wherein one or both of the covers and base are formed from a material that is impact resistant up to 250 J/m².

11. The location tag housing of claim 10, wherein the cover and the base are formed from a material that is non porous which facilitates easy cleaning and reduces microbe attachment.

12. The location tag housing of claim 11, comprises a label adhered to a top surface of the cover by adhesive, wherein the adhesive comprises a peel adhesion of up to 704 N/m or 4 lbs./in, and wherein the label is a polyester label.

13. The location tag housing of claim 6, wherein the base is 4 cm long and 4 cm wide, the cover is 4 cm long and 3 cm wide, and the rim is 4 cm long and 2 cm wide.

14. The location tag housing of claim 6, wherein the rim defines a rectangular shape that is complementary to the shape of the connecting edge, and wherein length and width of the connecting edge is greater than the length and width of the rim such that the connecting edge snap fits around the outside of the rim.

15. The location tag housing of claim 6, wherein the rim defines a rectangular shape that is complementary to the shape of the connecting edge, and wherein length and width of the connecting edge is less than the length and width of the rim such that the connecting edge snap fits around the inside of the rim.

16. The location tag housing of claim 15, wherein the connecting edge snap fits to the rim by deforming as the cover being pushed onto the base, wherein the snap is caused by a mechanical deflection of the connecting edge by the.

17. The location tag housing of claim 10, is configured to receive and retain an electronic tag, battery, and internal PCB, and wherein the housing is less than 12 g in weight.

18. The location tag housing of claim 6, wherein the cover comprises rounded edges and rounded corners to define a smooth and seamless structure.

19. The location tag housing of claim 1, wherein the snap fit includes a single snap fit arranged to prevent tampering.

20. The location tag housing of claim 19, wherein the snap fit is configured as a single-use connection, such that disassembly of the cover from the base provides a permanent visual indication of tampering with the housing.

21. The location tag housing of claim 6, wherein an inner surface of the cover comprises a plurality of posts extending into the receptacle, the posts configured to engage and immobilize a location tag within the receptacle when the cover is attached to the base.

* * * * *